US007729106B2

(12) United States Patent
D'Urso et al.

(10) Patent No.: US 7,729,106 B2
(45) Date of Patent: Jun. 1, 2010

(54) SMUDGE REMOVAL FROM ELECTRONIC DEVICE DISPLAYS

(75) Inventors: John J. D'Urso, Chandler, AZ (US); Steven M. Smith, Gilbert, AZ (US); Steven A. Voight, Gilbert, AZ (US); Steve X. Dai, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 672 days.

(21) Appl. No.: 11/693,445

(22) Filed: Mar. 29, 2007

(65) Prior Publication Data

US 2008/0236632 A1 Oct. 2, 2008

(51) Int. Cl.
*H05K 5/00* (2006.01)
*H04M 1/00* (2006.01)

(52) U.S. Cl. ............... 361/679.01; 134/32; 340/384.71; 455/567

(58) Field of Classification Search ............ 361/679.01, 361/679.21; 134/32; 340/384.71, 566; 455/567
See application file for complete search history.

(56) References Cited

U.S. PATENT DOCUMENTS

| | | | | |
|---|---|---|---|---|
| 5,787,168 | A * | 7/1998 | Lien | 455/567 |
| 6,059,628 | A * | 5/2000 | Yoo et al. | 445/58 |
| 6,250,765 | B1 * | 6/2001 | Murakami | 359/609 |
| 6,660,388 | B2 * | 12/2003 | Liu et al. | 428/421 |
| 7,019,622 | B2 * | 3/2006 | Orr et al. | 340/407.1 |
| 7,136,894 | B2 * | 11/2006 | Britt, Jr. | 709/201 |
| 7,320,600 | B2 * | 1/2008 | Fyke | 455/90.3 |
| 7,446,650 | B2 * | 11/2008 | Scholfield et al. | 340/438 |
| 2001/0055529 | A1 | 12/2001 | Wixforth | |
| 2002/0098874 | A1 * | 7/2002 | Zirul et al. | 455/567 |
| 2002/0122925 | A1 * | 9/2002 | Liu et al. | 428/331 |
| 2003/0214588 | A1 * | 11/2003 | Takizawa et al. | 348/207.99 |
| 2003/0228881 | A1 * | 12/2003 | Yamamoto et al. | 455/567 |
| 2008/0266766 | A1 * | 10/2008 | D'Urso et al. | 134/15 |

FOREIGN PATENT DOCUMENTS

| | | | |
|---|---|---|---|
| EP | 1712531 | A2 | 10/2006 |

OTHER PUBLICATIONS

Wixforth, Achim, Acoustically driven planar microfluidics, Superlattices and Microstructures 33 (2003) 389.
Takeuchi, M., et al., Ultrasonic Micromanipulation of Liquid Droplets for a Lab-on-a-Chip, 2005 IEEE Ultrasonic Symposium, pp. 1518-1521.
Chen, Xi et al., Surface Liquid Droplet Motion on Silicon Ultrasonic Horn Actuators, 2005 IEEE Ultrasonic Symposium pp. 1032-1035.
Kwon, J.W., et al., Directional droplet ejection by nozzleless acoustic ejectors built on ZnO and PZT, Institute of Physic Publishing, Journal of Micromechanics and Microengineering 2006, pp. 2697-2704.

* cited by examiner

*Primary Examiner*—Jayprakash N Gandhi
*Assistant Examiner*—Adrian S Wilson

(57) ABSTRACT

An apparatus and method is provided for removing smudges (506, 706, 806, 906) including oils and dust from portable electronic displays. The apparatus comprises a display device (110, 150, 500, 700, 800, 900, 1000) positioned within a housing (102, 104, 808), comprising a transparent cover (302, 502, 702, 802, 902, 1002) having a surface (508, 908) viewable through an opening in the housing (102, 104, 808) and a susceptibility to receiving contaminants (506, 706, 806, 906). A vibration device (504, 704, 804, 904, 1004) is positioned against the transparent cover (302, 502, 702, 802, 902, 1002) to provide motion (510) in a direction parallel to the surface, thereby causing the contaminants to move (708) across the surface (508, 908). The contaminants (506, 706, 806, 906) may then be hidden by the housing (102, 104, 808) or ejected by a motion (912) perpendicular to the surface by another vibrating device (911). Electronic circuitry (505) is provided for activating the vibration device (504, 704, 804, 904, 1004) either during normal operation of the electronic device or as selected by the user.

17 Claims, 3 Drawing Sheets

SMUDGE REMOVAL FROM ELECTRONIC DEVICE DISPLAYS

FIELD OF THE INVENTION

The present invention generally relates to portable electronic device displays and more particularly to an apparatus and method for removing smudges including oils and dust therefrom.

BACKGROUND OF THE INVENTION

In many portable electronic devices, such as mobile communication devices, displays present information to a user. For example, polymer-dispersed liquid crystal (PDLC) display technology can display video and text information. These optical displays, especially touch panel displays, typically comprise a transparent or a high gloss reflective surface thermoplastic or glass layer. While these transparent layers have excellent transparency and are physically strong, they suffer both aesthetic and functional degradation due to the build up of oils and other contaminants during use. This is particularly true for the display components of products which receive significant handling, such as persona data assistants (PDAs) and cell phones. For these displays, any type of fouling is especially undesirable as it tends to be very noticeable to the user and can result in a less than satisfactory viewing experience.

While screen protectors are available for many of these products, they do not offer an optimal solution. Most are based on anti-fouling coatings that reduce but do not eliminate smudges. Furthermore, the screen protectors often become scratched or otherwise degraded, necessitating that the consumer periodically replace them. For example, see U.S. Pat. No. 6,660,388 and European patent application EP 1 712 531 A2.

Accordingly, it is desirable to provide an apparatus and method for removing smudges including oils and dust from portable electronic devices. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

An apparatus and method are provided for removing smudges including oils and dust from displays of a portable electronic device. The electronic device includes a display positioned within a housing. A transparent cover of the display has a surface viewable outside of the housing and is susceptible to receiving a smudge. A vibration device is coupled to the transparent cover to provide motion in a direction parallel to the surface, thereby causing the smudges to migrate from a viewing area of the display.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

An integrated solution that maintains the cleanliness of display surfaces without user intervention incorporates acoustic, ultrasonic, or other types of vibrational actuators coupled to the display. Vibration of the display causes droplets of oil, fatty acids, and other contaminants to migrate across the surface resulting in a clean viewing area. Asymmetric vibrations may be generated from the edges of the display screen or cover. This approach may be particularly suitable to cell phones as haptic devices providing feedback to the user may also be connected to the display to cause migration of the contaminants by causing a spatial displacement of the display. Therefore, rather than having to incorporate a vibration device specifically to generate acoustic waves on the face of the display, an existing element may be adapted to serve a dual role.

An alternative approach is to incorporate piezoelectric thin films onto the display. While it would be preferred to cover the entire surface of the display with such films, the piezoelectric thin films may cover only a portion of the display, e.g., the edges or periphery of the display. Surface acoustic wave filters can actuate droplet motion with very small amplitudes. Furthermore, the display cover material, thickness, tapering, and shape may be tailored to achieve optimum contaminant migration.

As the contaminants build up in peripheral areas, they can be hidden under a portion of the device housing, moved via capillary or self driven flow effects to areas less noticeable, or pooled into areas where removal is can be efficiently done by methods such as ejection by additional vibratory motion in a direction perpendicular to the screen or wiping by holster elements.

Figure 1:
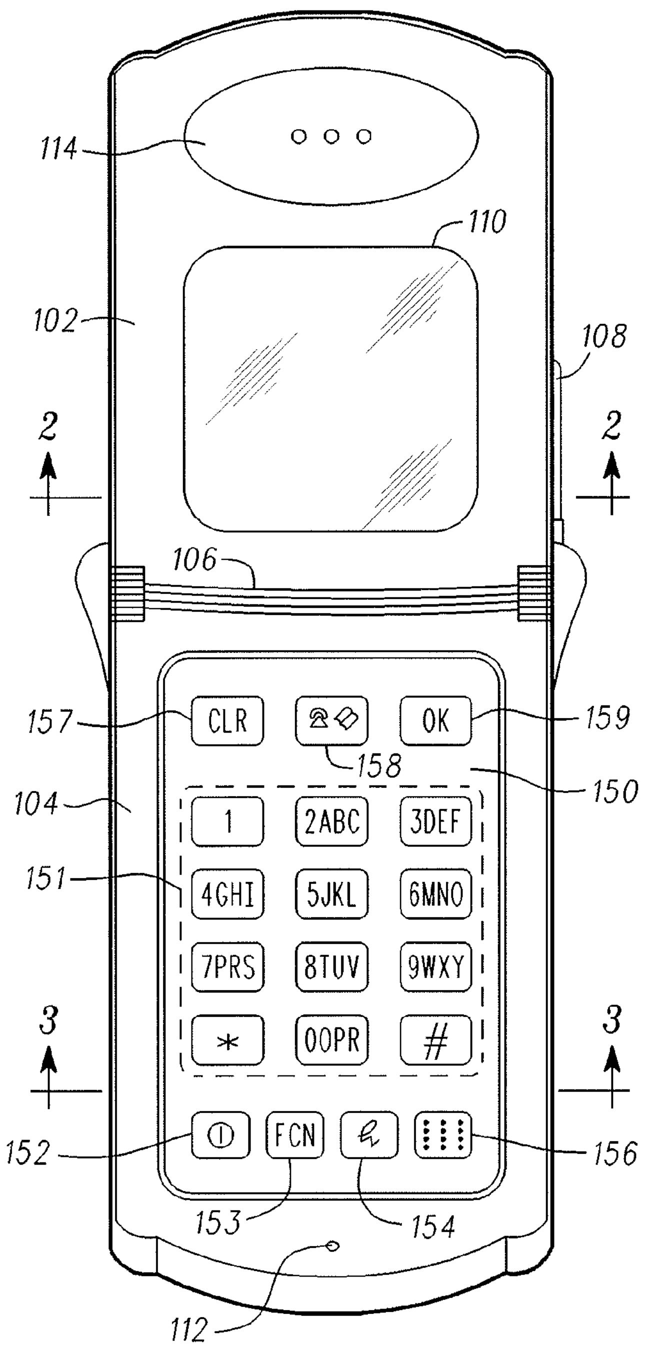
FIG. 1 is a front view of a mobile communication device having a touch screen in accordance with an exemplary embodiment.

Although the apparatus and method described herein may be used with an exposed display surface for any type of electronic device, the exemplary embodiment as shown in FIG. 1 comprises a mobile communication device 100 implementing a touchscreen. While the electronic device shown is a mobile communication device 100, such as a flip-style cellular telephone, the touchscreen can also be implemented in cellular telephones with other housing styles, personal digital assistants, television remote controls, video cassette players, household appliances, automobile dashboards, billboards, point-of-sale displays, landline telephones, and other electronic devices.

The mobile communication device 100 has a first housing 102 and a second housing 104 movably connected by a hinge 106. The first housing 102 and the second housing 104 pivot between an open position and a closed position. An antenna 108 transmits and receives radio frequency (RF) signals for communicating with a complementary communication device such as a cellular base station. A display 110 positioned on the first housing 102 can be used for functions such as displaying names, telephone numbers, transmitted and received information, user interface commands, scrolled menus, and other information. A microphone 112 receives sound for transmission, and an audio speaker 114 transmits audio signals to a user.

A keyless input device 150 is carried by the second housing 104. The keyless input device 150 is implemented as a touchscreen with a display. A main image 151 represents a standard, twelve-key telephone keypad. Along the bottom of the keyless input device 150, images 152, 153, 154, 156 represent an on/off button, a function button, a handwriting recognition mode button, and a telephone mode button. Along the top of the keyless input device 150, images 157, 158, 159 represent a "clear" button, a phonebook mode button, and an "OK" button. Additional or different images, buttons or icons representing modes, and command buttons can be implemented using the keyless input device. Each image 151, 152, 153, 154, 156, 157, 158, 159 is a direct driven pixel, and this keyless input device uses a display with aligned optical shutter and backlight cells to selectively reveal one or more images and provide contrast for the revealed images in both low-light and bright-light conditions.

Figure 2:
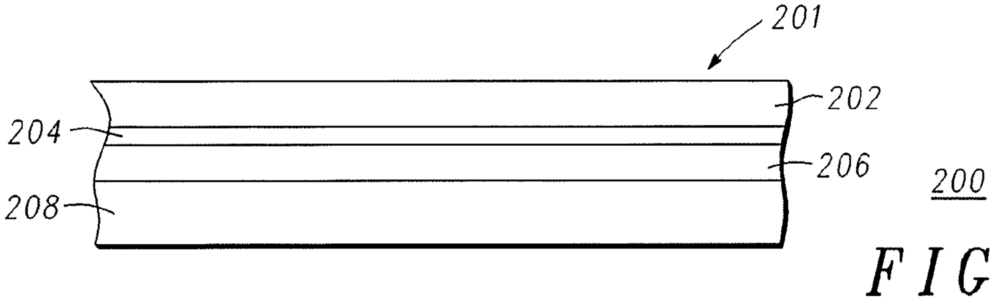
FIG. 2 is a partial cross-section of a conventional touch screen taken along line 2-2 of FIG. 1.

Referring to FIG. 2, a cross section of a conventional touchscreen 200 is depicted that is usable for either the display 110 or the keyless input device 150 with the cross-section, for example, being a portion of a view taken along line 2-2 of FIG. 1. The conventional display 200 is a stack with a user-viewable and user-accessible face 201 and multiple layers below the face 201, including a transparent cover 202, a thin transparent conductive coating 204, a substrate 206, and an imaging device 208. The transparent cover 202 provides an upper layer viewable to and touchable by a user and may provide some glare reduction. The transparent cover 202 also provides scratch and abrasion protection to the layers 204, 206, 208 contained below.

The substrate 206 protects the imaging device 208 and typically comprises plastic, e.g., polycarbonate or polyethylene terephthalate, or glass, but may comprise any type of material generally used in the industry. The thin transparent conductive coating 204 is formed over the substrate 206 and typically comprises a metal or an alloy such as indium tin oxide or a conductive polymer.

Figure 3:
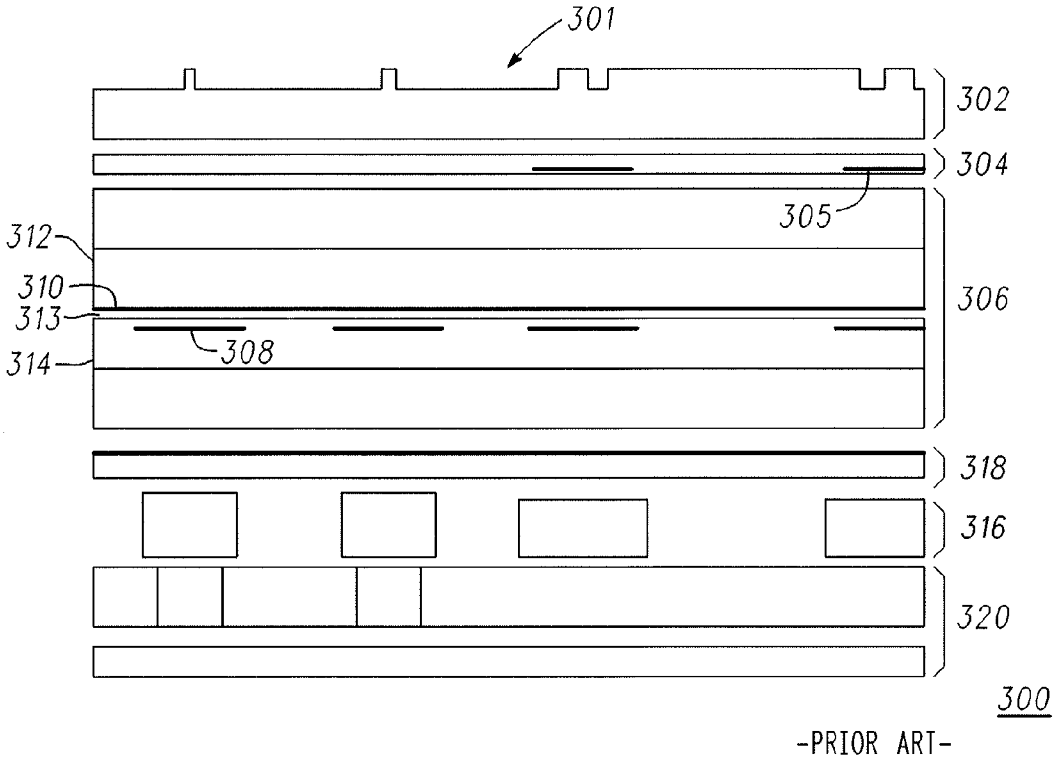
FIG. 3 is a cross sectional diagram of a conventional TN/PDLC touch screen.

Referring to FIG. 3, a cross section of a conventional display 300 is depicted with aligned optical shutter and backlight cells and is usable for the display 110 of FIG. 1 with the cross-section being a portion of a view taken along line 3-3 of FIG. 1. The conventional display 300 is a stack with a user-viewable and user-accessible face 301 and multiple layers below the face 301, including a transparent cover 302 and a capacitive sensor layer 304 with an indium-tin oxide (ITO) electrode 305. The transparent cover 302 provides an upper layer viewable to and touchable by a user and may provide some glare reduction. The capacitive sensor layer 304 senses touchscreen inputs on the transparent cover 302 of the display 300. Beneath the capacitive sensor layer 304 is a twisted nematic (TN) stack layer 306 including a TN backplane electrode 310 and TN segment electrodes 308 between two substrates 312, 314 for providing the optical shutter operation of the display 300. The TN backplane electrode 310 and TN segment electrodes 308 are formed of indium-tin oxide (ITO) material to provide both transparency and electrical conductivity for operation of the TN stack. Also, while the TN backplane electrode 310 is depicted above the TN segment electrodes 308, a TN stack layer 306 having the TN backplane electrode 310 below the TN segment electrodes 308 would function similarly.

The TN stack layer 306 utilizes, for example, twisted nematic (TN) liquid crystal (TNLC) display technology employing TN optical shutter material in an optical shutter layer 313 and the TN segment electrodes 308 to provide optical shutter operation. While TNLC technology is described herein for the optical shuttering operation, the optical shutter layer 313, sandwiched between the TN backplane electrodes 310 and the TN polymer segment electrodes 308, can alternatively be made using nematic liquid crystal technology (such as twisted nematic or super twisted nematic liquid crystals), polymer-dispersed liquid crystal technology (PDLC), ferroelectric liquid crystal technology, electrically-controlled birefringent technology, optically-compensated bend mode technology, guest-host technology, and other types of light modulating techniques which use optical shutter material 313 such as TN polymer material, PDLC material, cholesteric material, or electro-optical material. The electric field created by the electrodes 308, 310 alter the light transmission properties of the TNLC optical shutter material 313, and the pattern of the TN segment electrode layer 308 defines pixels of the display. These pixels lay over the images 151, 152, 153, 154, 156, 157, 158, 159 shown in FIG. 1. In the absence of the electric field, the liquid crystal material and dichroic dye in the TNLC material 313 are randomly aligned and absorb most incident light. In the presence of the electric field, the liquid crystal material and dichroic dye align in the direction of the applied field and transmit substantial amounts of incident light. In this manner, a pixel of the TNLC cell can be switched from a relatively non-transparent state to a relatively transparent state. Each pixel can be independently controlled to be closed-shuttered or open-shuttered, depending on the application of an electric field, and the pixels act as "windows" with optical shutters that can be opened or closed, to reveal images underneath (e.g. images 151, 152, 153, 154, 156, 157, 158, 159).

Beneath the TN stack layer 306 is an electroluminescent (EL) stack layer 316 separated from the TN stack layer 306 by an ITO ground layer 318. The EL stack layer 316 includes a backplane and electrodes which provide backlight for operation of the display 300 in both ambient light and low light conditions by alternately applying a high voltage level, such as one hundred volts, to the backplane and electrode. The ITO ground layer 318 is coupled to ground and provides an ITO ground plane 318 for reducing the effect on the capacitive sensor layer 304 of any electrical noise generated by the operation of the EL stack layer 316 or other lower layers within the display 300. Beneath the EL stack layer 316 is a base layer 320 which may include one or more layers such as a force sensing switch layer and/or a flex base layer. The various layers 302, 304, 306, 318, 316 and 320 are adhered together by adhesive layers applied therebetween.

Figure 4:
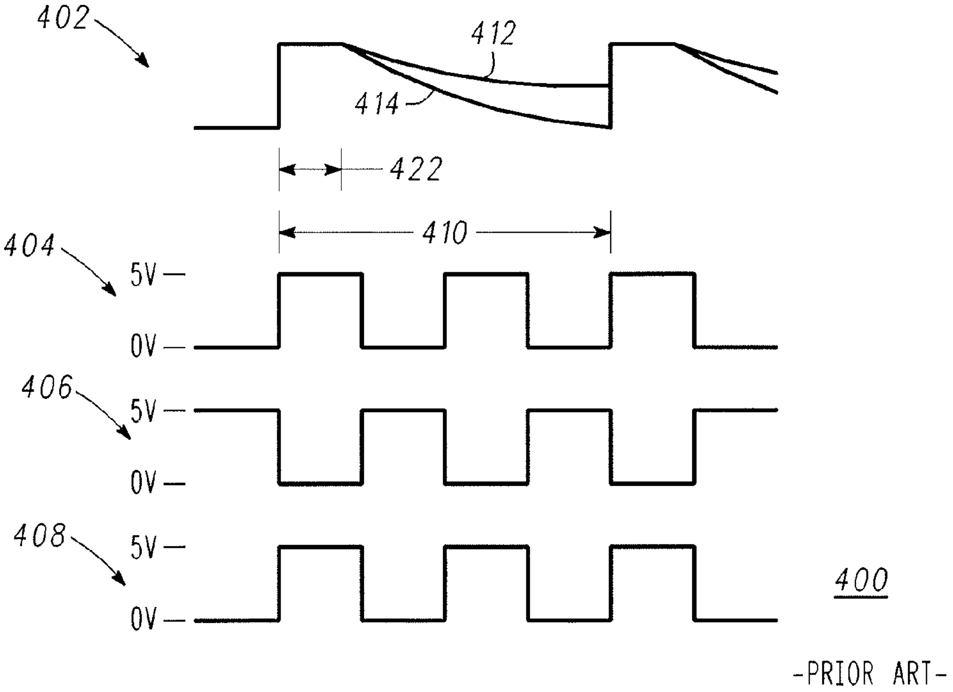
FIG. 4 is a timing diagram for a display driver and a capacitive sensor operating the touch screen of FIG. 2 in a conventional manner.

Conventional operation of the display 300 is illustrated in FIG. 4, wherein the charge 402 from the capacitive sensor layer 304, the voltage 404 of the TN backplane 310 and the voltages 406, 408 of first and second portions of the TN segment electrodes 308 are depicted. To perform capacitive sensing during a period 410, a charging voltage is provided to the ITO electrode 305 of the capacitive sensor layer 304 for a first portion 422 of the period 410. After the charging voltage is removed from the electrode 305, the charge 402 has two different decay profiles 412, 414 depending on whether a user's touch is detected on the display 300. In an electrically noisy environment, the signal-to-noise ratio (SNR) of the capacitive sensing (i.e., of the voltage of the detectable charge), where the charge is the multiple of the capacitance (determined from a distance of user's finger from the face 301) times the voltage thereof, is small, thereby complicating detection of touchscreen inputs. The ITO ground plane layer 318 provides some isolation between the high voltage EL backlight layer 316 and the low voltage TN stack layer 306, thereby increasing the SNR of the capacitive sensing.

During the same time period 410, the voltages 404, 406, 408 supplied to the TN backplane 310 and the TN segment electrodes 308 are switched between a positive voltage, typically about five volts, and zero volts. The voltage 406 of the portion of the TN segment electrodes 308 that are turned "on" to render corresponding portions of the display 300 over such portion of the TN segment electrodes 308 relatively transparent are switched opposite to the voltage 404 of the TN backplane 310 (i.e., when the voltage 304 of the TN backplane is high, the voltage 406 of the "on" portion of the TN segment electrodes 308 is low). Conversely, the voltage 408 of the portion of the TN segment electrodes 308 that are turned "off" optically shutter corresponding portions of the display 300 over such portion of the TN segment electrodes 308 because their voltage is switched in the same manner as the voltage 404 of the TN backplane 310. It can be seen from FIG. 4 that during period 410, the voltages 406, 408 supplied to the TN segment electrodes 308 and the TN backplane 310 are high approximately fifty per cent of the time period 410.

Those skilled in the art will appreciate that other types of imaging devices 200, 300 may be utilized as exemplary embodiments, including, for example, transmissive, reflective or transflective liquid crystal displays, cathode ray tubes, micromirror arrays, and printed panels.

Figure 5:
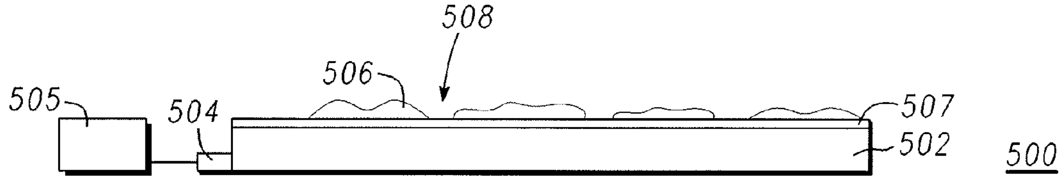
FIG. 5 is a partial cross-section of a display screen in accordance with a first exemplary embodiment.

Referring to FIG. 5 and in accordance with a first exemplary embodiment, a display device 500 includes a vibration device 504 attached to a transparent cover 502. The transparent cover 502 may comprise a cover on any type of display, for example, the transparent covers 202 of FIG. 2 and the transparent cover 302 of FIG. 3. The vibration device 504 may comprise, for example, a piezo electric transducer, and may comprise a haptic element that is otherwise used in an electronic device to provide information to the user, including for example, feedback relating to key activation. The vibration device 504 is coupled to electronic circuitry 505 within the electronic device for selectively activation. An optional layer 507 comprising an antistatic coating may be formed on the transparent cover 502 that repels contaminants 506 such as dust.

Figure 6:
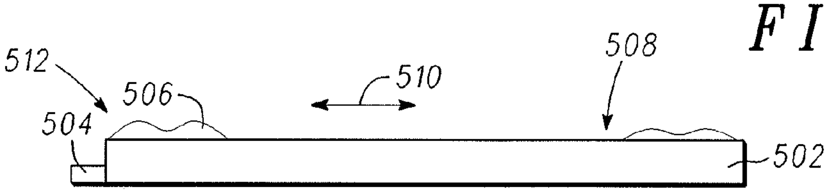
FIG. 6 is a partial cross-section of the display screen of FIG. 5 after a vibratory motion has been activated.

During use of the display device 500, contaminants 506 from, for example, dust and oils from the user's touch, accumulate on the viewing surface 508 as shown in FIG. 6. These contaminants 506 impede the ability of the user to view the information presented through the transparent cover 502. The activation of the vibration device 504 may be accomplished routinely during operation of the electronic device or as selected by the user. Activation of the vibration device 504 causes the transparent cover 502 to move in a direction 510 (See FIG. 6) that is parallel with the viewing surface 508. This motion of the transparent cover 502 causes the contaminants 506 to migrate to the periphery 512 of the viewing surface 510 and away from the area viewed by the user. This migration of the contaminants 506 may be assisted by other forces such as gravity.

Figure 7:
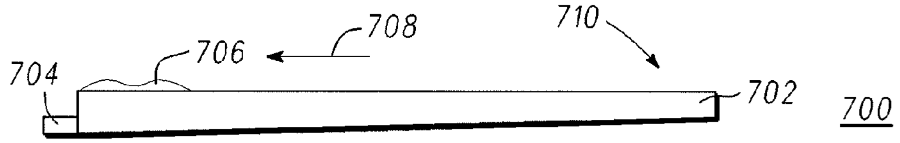
FIG. 7 is a partial cross-section of a display screen in accordance with a second exemplary embodiment.

A second exemplary embodiment is shown in FIG. 7 and comprises an electronic device 700 having a transparent cover 702 coupled to a vibration device 704. In this case, the vibration device is coupled or mounted in such a way as to induce vibration of the lense in the out of plane direction. The tapering of the transparent cover 702 leads to an asymmetry in vibrational amplitudes which causes migration of the contaminants 706 in a direction 708 away from the smaller end 710 of the transparent cover 702. It should be noted that vibrational asymmetry may be created by using vibrational device(s) which generate surface waves asymmetrically or by a physical grading of layer 702 by varying the density of a piece of uniform thickness or tapering the dimensions of the layer 702. An optional layer may be included to enhance motion. It may also comprise a smudge resistant layer such as a fluoropolymer based coating which would also minimize friction.

Figure 8:
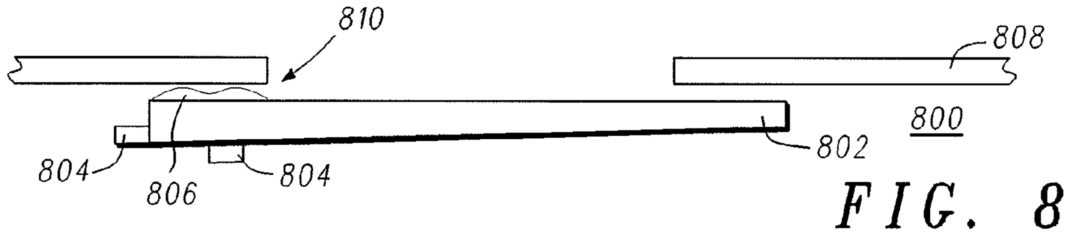
FIG. 8 is a partial cross-section of a display screen in accordance with a third exemplary embodiment.

Once the contaminants 506, 706 have migrated to the periphery, the contaminants 506, 706 may be hidden or eliminated by removal from the transparent cover 502, 702. For example, as shown in FIG. 8, the electronic device 800 includes a housing 808 that extends over the periphery 810 and covers or hides the contaminants 806 that have migrated across the transparent cover 802. FIG. 8 further shows multiple vibration devices 804 may be connected to the transparent cover 802 to enhance the movement thereof.

Figure 9:
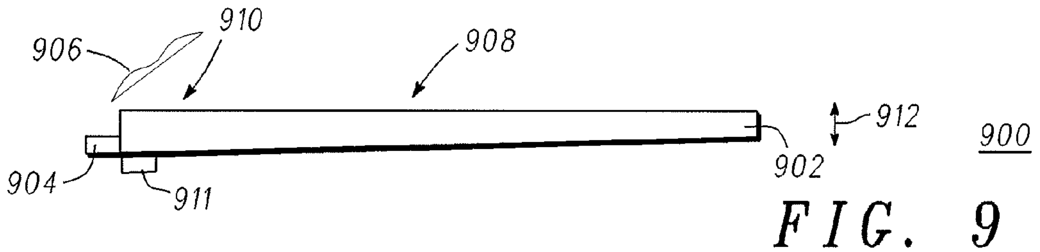
FIG. 9 is a partial cross-section of a display screen in accordance with a fourth exemplary embodiment.

FIG. 9 shows a fourth embodiment wherein the contaminants 906 are ejected from the transparent cover 902 by a vibration device 911 connected to the transparent cover 902 and imparts a motion 912 perpendicular to the surface 908 of the transparent cover 902. Preferably, the vibration device 904 has caused the contaminants 906 to migrate to the periphery 910 prior to activation of the vibration device 911 that flicks or ejects the contaminants 906 from the transparent cover 902; however, the vibration devices 904 and 911 may operate simultaneously.

Figure 10:
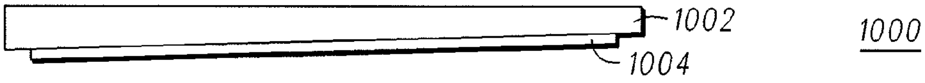
FIG. 10 is a partial cross-section of a display screen in accordance with a fifth exemplary embodiment.
Figure 11:
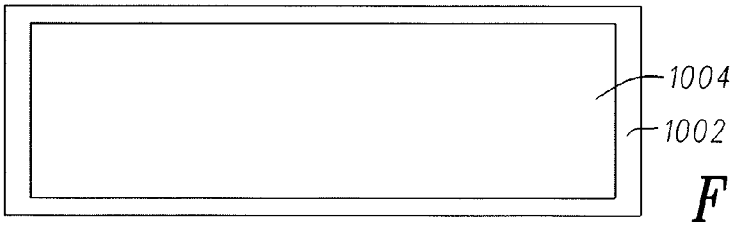
FIG. 11 is a bottom view of the display screen of FIG. 10.

FIGS. 10 (partial cross-sectional view) and 11 (bottom view) show how one or more thin piezoelectric layers 1004 may be attached to the top or bottom of the transparent cover 1002 in a very space efficient manner. Piezoelectric plate-like elements could be bonded with one or two-part epoxy. Curing of the epoxy could be at elevated or ambient temperatures depending on epoxy specification and preferred stress loading on piezoelectric elements. Other adhesive materials, for example, pressure sensitive adhesives, may also applicable.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. An electronic device comprising:

a housing;

a display device positioned within the housing and comprising:

a transparent cover having a surface viewable outside of the housing and susceptible to receiving a smudge; and a vibration device coupled to the transparent cover to provide motion in a direction parallel to the surface; and electronic circuitry to present information through the transparent cover; wherein the transparent cover is physically graded and the motion generated by the vibration device causes a smudge to move across the graded transparent cover to a periphery of the transparent cover.

2. The electronic device of claim 1 wherein the housing covers the periphery.

3. The electronic device of claim 1 further comprising at least one more vibration device coupled to the transparent cover.

4. The electronic device of claim 1 further comprising a layer resistant to smudges position over the transparent cover.

5. The electronic device of claim 1 wherein the vibration device comprises a thin piezoelectric layer.

6. An electronic device comprising:

a housing defining an opening; and a display device positioned within the housing, comprising:

a transparent cover having a surface viewable through the opening and susceptible to receiving contaminants;

a vibration device positioned against the transparent cover to provide motion in a direction parallel to the surface, thereby causing the contaminants to move across the surface; and electronic circuitry for activating the vibration device; wherein the transparent cover is physically graded and the motion generated by the vibration device causes a smudge to move across the graded transparent cover to a periphery of the transparent cover.

7. The electronic device of claim 6 wherein the housing covers the periphery.

8. The electronic device of claim 6 further comprising at least one more vibration device positioned against the transparent cover.

9. The electronic device of claim 6 further comprising a layer resistant to smudges position over the transparent cover.

10. The electronic device of claim 6 wherein the vibration device comprises a thin piezoelectric layer.

11. A method of removing contaminants from the transparent surface of an electronic device display, comprising vibrating the surface in a direction parallel to the surface, wherein the contaminants migrate to a periphery of the surface; wherein the transparent cover is tapered to have a larger end and a smaller end, the vibration causing the contaminants to migrate to the larger end.

12. The method of claim 11 further comprising ejecting the contaminants by vibrating the surface in a direction perpendicular to the transparent surface.

13. The method of claim 11 wherein a portion of a housing covers the periphery, the vibration causing the contaminants to migrate under the portion of the housing covering the periphery.

14. The method of claim 11 further comprising at least two vibration devices coupled to the transparent cover.

15. The method of claim 11 further comprising a layer resistant to smudges position over the transparent cover.

16. The method of claim 11 wherein the vibration is created by a thin piezoelectric layer.

17. The method of claim 11 wherein the vibrating step comprises generating asymmetrical surface waves.

* * * * *